(12) United States Patent
Osugi et al.

(10) Patent No.: US 7,609,133 B2
(45) Date of Patent: Oct. 27, 2009

(54) PIEZOELECTRIC THIN FILM DEVICE HAVING AN ADDITIONAL FILM OUTSIDE AN EXCITATION REGION

(75) Inventors: Yukihisa Osugi, Nagoya (JP); Shoichiro Yamaguchi, Ichinomiya (JP); Tomoyoshi Tai, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 227 days.

(21) Appl. No.: 11/681,324

(22) Filed: Mar. 2, 2007

(65) Prior Publication Data
US 2007/0210877 A1    Sep. 13, 2007

(30) Foreign Application Priority Data
Mar. 7, 2006  (JP) .............................. 2006-061439
May 23, 2006 (JP) .............................. 2006-142658

(51) Int. Cl.
*H03H 9/15* (2006.01)
*H03H 9/54* (2006.01)

(52) U.S. Cl. ...................... 333/187; 310/322; 310/326

(58) Field of Classification Search ......... 333/187–189; 310/322, 324, 326
See application file for complete search history.

(56) References Cited
U.S. PATENT DOCUMENTS

| | | | | |
|---|---|---|---|---|
| 3,585,418 A * | 6/1971 | Koneval | ...................... | 310/326 |
| 5,617,065 A * | 4/1997 | Dydyk | ........................ | 333/186 |
| 6,150,703 A * | 11/2000 | Cushman et al. | ............ | 257/415 |
| 6,424,237 B1 * | 7/2002 | Ruby et al. | ................ | 333/187 |
| 6,788,170 B1 * | 9/2004 | Kaitila et al. | ............... | 333/187 |
| 7,161,447 B2 * | 1/2007 | Nomura et al. | ............. | 333/187 |
| 7,199,683 B2 * | 4/2007 | Thalhammer et al. | ....... | 333/187 |
| 7,230,511 B2 * | 6/2007 | Onishi et al. | ................ | 333/187 |
| 7,423,501 B2 * | 9/2008 | Kim et al. | ................... | 333/187 |

FOREIGN PATENT DOCUMENTS

| | | |
|---|---|---|
| JP | 2003-318695 | 11/2003 |
| JP | 2004-104449 | 4/2004 |
| JP | 2004-120494 | 4/2004 |

* cited by examiner

*Primary Examiner*—Barbara Summons
(74) *Attorney, Agent, or Firm*—Burr & Brown

(57) ABSTRACT

An object of the present invention is to provide a piezoelectric thin film device including a single or a plurality of film bulk acoustic resonators wherein a frequency impedance characteristic is unsusceptible to spuriousness. In a film bulk acoustic resonator, a piezoelectric thin film is supported by a support substrate via an adhesive layer. An upper electrode and a lower electrode each having a predetermined pattern are formed on upper and lower surfaces of the piezoelectric thin film. Further, on the upper surface of the piezoelectric thin film, an additional film for adding a mass to an outside of an excitation region is formed as superposed on the upper electrode.

9 Claims, 9 Drawing Sheets

F I G . 1
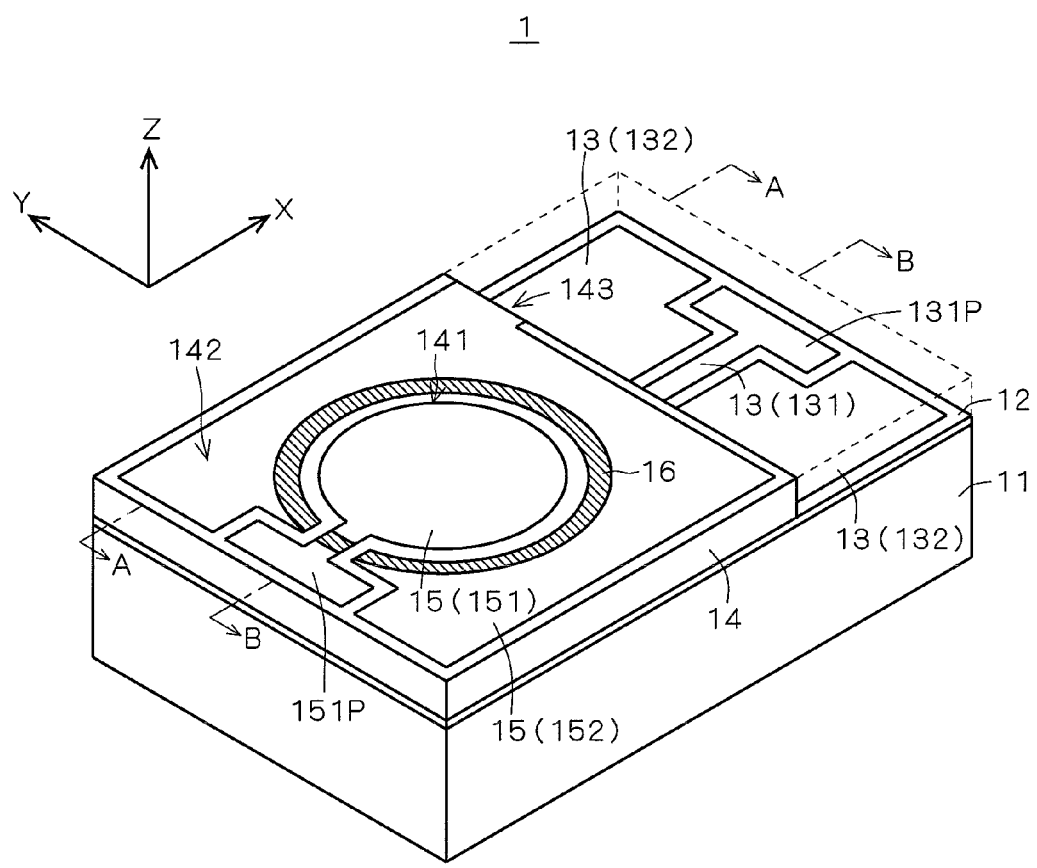

F I G. 1 1
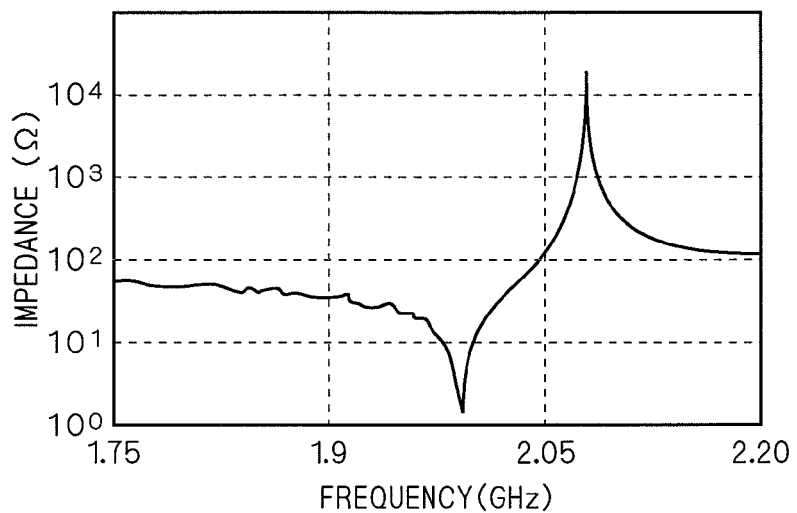
F I G. 1 2
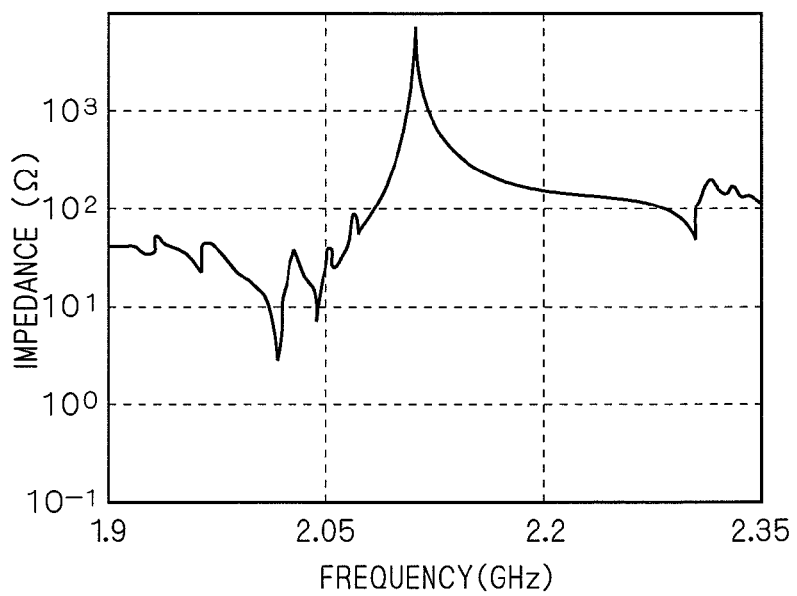

PIEZOELECTRIC THIN FILM DEVICE HAVING AN ADDITIONAL FILM OUTSIDE AN EXCITATION REGION

BACKGROUND OF THE INVENTION

1. Field of the Invention

The present invention relates to a piezoelectric thin film device including a single or a plurality of film bulk acoustic resonators (FBAR).

2. Description of the Background Art

A film bulk acoustic resonator constituting a piezoelectric thin film device has hitherto been obtained by forming excitation electrodes, on both main surfaces of a piezoelectric thin film, opposed to each other with the piezoelectric thin film interposed therebetween, in an excitation region where vibrations are excited (e.g. see Japanese Patent Application Laid-Open No. 2003-318695).

However, there has been a problem with the conventional piezoelectric thin film device that a frequency impedance characteristic of the film bulk acoustic resonator is susceptible to spuriousness caused by vibrations in an unexpected mode.

SUMMARY OF THE INVENTION

The present invention relates to a piezoelectric thin film device including a single or a plurality of film bulk acoustic resonators.

According to the present invention, a piezoelectric thin film device includes a single or a plurality of film bulk acoustic resonators, the piezoelectric thin film device including: a piezoelectric thin film; a support for supporting the piezoelectric thin film; electrode films formed on both main surfaces of the piezoelectric thin film and having predetermined patterns; and a first additional film formed outside an excitation region for exciting vibrations on at least one of the main surfaces of the piezoelectric thin film.

Herewith, since the additional film prevents diffusion of an acoustic wave, a frequency impedance characteristic of the film bulk acoustic resonator becomes unsusceptible to spuriousness.

Preferably, the first additional film is formed on an outer edge section along an outer periphery of the excitation region.

Herewith, a characteristic of the piezoelectric thin film device can be improved.

Preferably, the second additional film has a thickness larger than that of the first additional film.

Herewith, since energy trapping into the excitation region can be realized, the frequency impedance characteristic of the film bulk acoustic resonator becomes unsusceptible to spuriousness.

Preferably, a material constituting the first additional film is a metal.

Herewith, the additional film can be provided with a function as the electrode film.

Preferably, a mass per unit area of the first additional film formed as superposed on the electrode film is not less than 0.1% and not more than 20% of a sum of a mass per unit area of the piezoelectric thin film and a mass per unit area of the electrode film in the excitation region.

Herewith, the frequency impedance characteristic of the film bulk acoustic resonator becomes further unsusceptible to spuriousness.

Preferably, the mass per unit area of the first additional film formed as superposed on the electrode film is not less than 1% and not more than 10% of the sum of the mass per unit area of the piezoelectric thin film and the mass per unit area of the electrode film in the excitation region.

Herewith, an influence of supporting by the support substrate can be avoided.

Accordingly, an object of the present invention is to provide a piezoelectric thin film device including a single or a plurality of film bulk acoustic resonators wherein the frequency impedance characteristic is unsusceptible to spuriousness.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is an oblique view showing a schematic configuration of a film bulk acoustic resonator according to a first embodiment of the present invention;

FIG. 11 is a view showing a frequency impedance characteristic of a film bulk acoustic resonator according to Example 2;

FIG. 12 is a view showing a frequency impedance characteristic of a film bulk acoustic resonator according to Comparative Example.

DESCRIPTION OF THE PREFERRED EMBODIMENTS

First Embodiment

Figure 2:
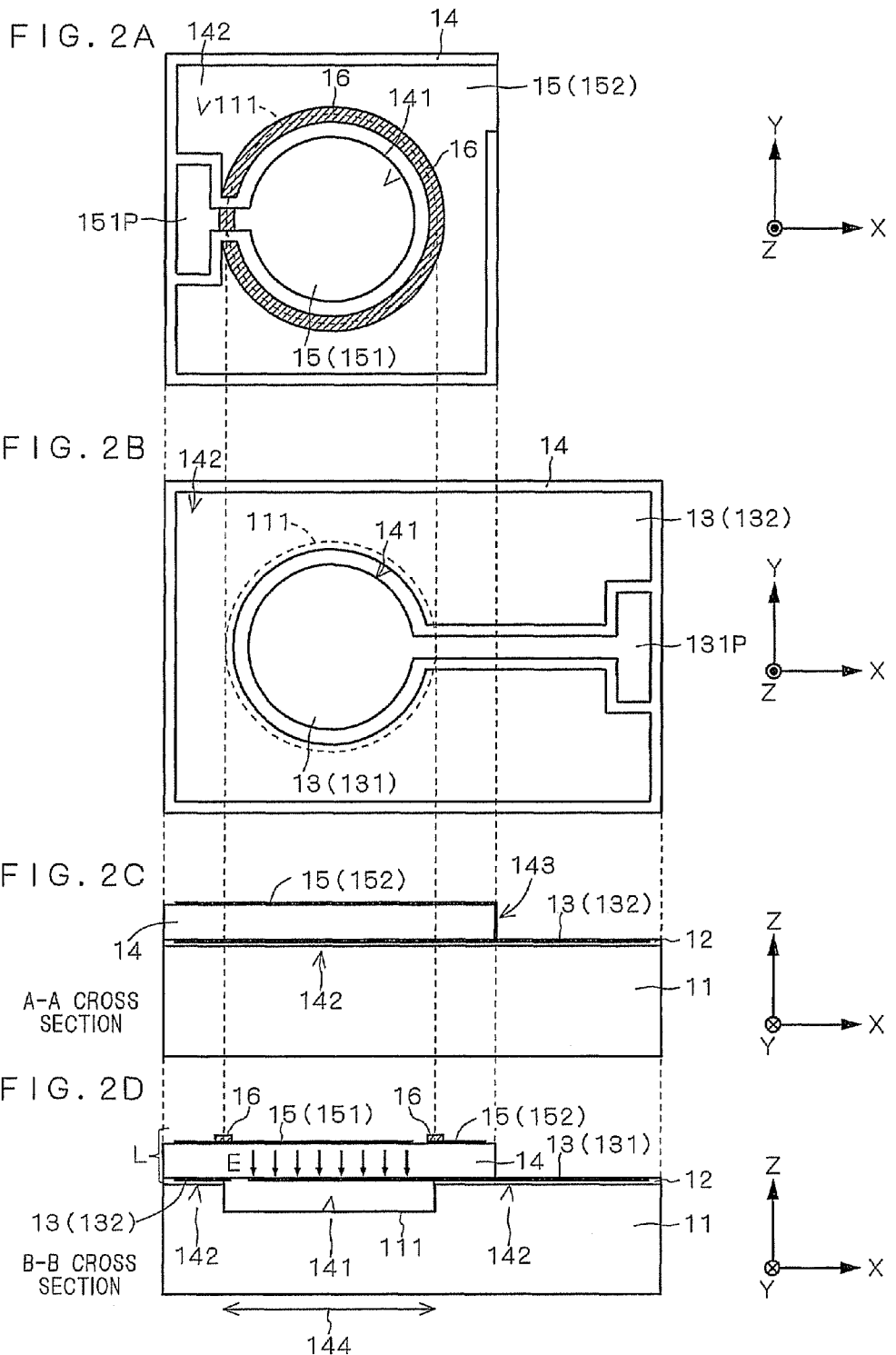
FIGS. 2A to 2D are views showing patterns of an upper electrode, a lower electrode, and an additional film when seen from above, and cross sections of the film bulk acoustic resonator along cutting-plane lines A-A and B-B of FIG. 1.

FIG. 1 is an oblique view showing a schematic configuration of a film bulk acoustic resonator (FBAR) 1 according to a first embodiment of the present invention. In FIG. 1, an XYZ orthogonal coordinate system is defined for the sake of explanation where the right-and-left direction is the X-axis direction, the front-and-back direction is the Y-axis direction, and the top- and bottom-direction is the Z-axis direction. This also applies to each of later-described figures. The film bulk acoustic resonator 1 is a resonator using an electrical response by means of thickness extension vibrations excited by a piezoelectric thin film 14.

As shown in FIG. 1, the film bulk acoustic resonator 1 has a configuration where an adhesive layer 12, a lower electrode 13, the piezoelectric thin film 14, an upper electrode 15 and an additional film 16 are laminated in this order on a support substrate 11. In the film bulk acoustic resonator 1, the piezoelectric thin film 14 has a size smaller than that of the support substrate 11 and part of the lower electrode 13 is in a state of being exposed.

In manufacture of the film bulk acoustic resonator 1, the piezoelectric thin film 14 is obtained by performing removal processing on a piezoelectric substrate that can independently stand up under its own weight, but the piezoelectric thin film 14 obtained by removal processing cannot independently stand up under its own weight. For this reason, prior to removal processing in manufacture of the film bulk acoustic resonator 1, a predetermined member including a piezoelectric substrate is previously bonded to the support substrate 11 as a support.

Support Substrate

When a piezoelectric substrate is subjected to removal processing during manufacture of the film bulk acoustic resonator 1, the support substrate 11 serves as a support, via the adhesive layer 12, the piezoelectric substrate with the lower electrode 13 formed on its lower surface. In addition, after manufacture of the film bulk acoustic resonator 1, the support substrate 11 also serves as a support, via the adhesive layer 12, the piezoelectric thin film 14 with the lower electrode 13 formed on its under surface and the upper electrode 15 on its upper surface. Therefore, the support substrate 11 is required to be able to stand the force applied at the time of removal processing on the piezoelectric substrate, and also required not to reduce its strength after manufacture of the film bulk acoustic resonator 1.

The material for and the thickness of the support substrate 11 can be selected as appropriate so as to satisfy the above-mentioned requirements. However, if the material for the support substrate 11 is a material having a thermal expansion coefficient close to that of the piezoelectric material constructing the piezoelectric thin film 14, and more desirably a material having a thermal expansion coefficient equivalent to that of the piezoelectric material constructing the piezoelectric thin film 14, e.g. the same material as the piezoelectric material constructing the piezoelectric thin first 14, it is possible to suppress warpage and damage caused by a difference in thermal expansion coefficient during manufacture of the film bulk acoustic resonator 1. It is further possible to suppress characteristic variations and damage caused by a difference in thermal expansion coefficient after manufacture of the film bulk acoustic resonator 1. In addition, in a case of using a material having an anisotropic thermal expansion coefficient, it is desirable to see that the thermal expansion coefficients in all different directions are made the same. Moreover, the same material as the piezoelectric material may be used in the same orientation as the piezoelectric material.

A cylindrical depression (concave portion or groove) 111 is formed in a predetermined region of the support substrate 11 opposed to an excitation region 141 of the piezoelectric thin film 14 (FIG. 2D). The depression 111 forms a cavity below the excitation region 141 of the piezoelectric thin film 14 to separate the excitation region 141 from the support substrate 11 so as to prevent vibrations excited by the excitation region 141 from interfering with the support substrate 11.

Adhesive Layer

The adhesive layer 12 serves to bond and fix the piezoelectric substrate with the lower electrode 13 formed on its bottom surface to the support substrate 11 when the piezoelectric substrate is subjected to removal processing during manufacture of the film bulk acoustic resonator 1. Additionally, the adhesive layer 12 also serves to bond and fix the piezoelectric thin film 14 with the lower electrode 13 formed on its lower surface and the upper electrode 15 on its upper surface to the support substrate 11 after manufacture of the film bulk acoustic resonator 1. Therefore, the adhesive layer 12 is required to be able to withstand the force applied at the time of removal processing on the piezoelectric substrate, and also required not to reduce its adhesive force after manufacture of the film bulk acoustic resonator 1.

A desirable example of the adhesive layer 12 satisfying such requirements may be an adhesive layer 12 formed of an organic adhesive agent, desirably an epoxy adhesive agent (adhesive layer made of an epoxy resin using thermosetting properties) or an acrylic adhesive agent (adhesive layer made of an acrylic resin using both thermosetting and photocuring properties), which has a filling effect and exerts sufficient adhesive force even when an object to be bonded is not completely flat. Adoption of such a resin allows prevention of unexpected formation of an air space between the piezoelectric substrate and the support substrate 11, thereby to prevent occurrence of cracking or the like at the time of removal processing on the piezoelectric substrate due to the air space. However, this does not prevent the piezoelectric thin film 14 and the support substrate 11 from being bonded and fixed to each other by an adhesive layer 12 different from the above-mentioned adhesive layer 12.

Piezoelectric Thin Film

The piezoelectric thin film 14 is obtained by performing removal processing on the piezoelectric substrate. More specifically, the piezoelectric thin film 14 is obtained by reducing the piezoelectric substrate in thickness from a thickness (e.g. not smaller than 50 μm) with which the substrate can independently stand up under its own weight, to a thickness (e.g. not larger than 10 μm) with which the substrate cannot independently stand up under its own weight.

As a piezoelectric material constructing the piezoelectric thin film 14, a piezoelectric material having a desired piezoelectric property can be selected, and it is desirable to select a single-crystal material including no grain boundary, such as quartz crystal ($SiO_2$), lithium niobate ($LiNbO_3$), lithium tantalite ($LiTaO_3$), lithium tetraborate ($Li_2B_4O_7$), zinc oxide (ZnO), potassium niobate ($KNbO_3$), or langasite ($La_3Ga_3SiO_{14}$). This is because the use of the single-crystal material as the piezoelectric material constructing the piezoelectric thin film 14 can lead to improvement in electromechanical coupling factor as well as mechanical quality factor of the piezoelectric thin film 14.

Further, a crystal orientation in the piezoelectric thin film 14 can be selected to be a crystal orientation having a desired piezoelectric characteristic. Here, the crystal orientation in the piezoelectric thin film 14 is desirably a crystal orientation that leads to favorable temperature characteristics of a resonance frequency and an antiresonance frequency of the film bulk acoustic resonator 1, and is further desirably a crystal orientation in which a resonance frequency temperature coefficient is "0".

Removal processing on the piezoelectric substrate is performed by mechanical processing such as cutting, grinding or polishing, or chemical processing such as etching. Here, if the piezoelectric substrate is subjected to removal processing where a plurality of removal processing methods are combined and the removal processing method is shifted in stages from one performed at high processing speed to one with small process degradation in an object to be processed, it is possible to improve the quality of the piezoelectric thin film 14 while maintaining high productivity, so as to improve the characteristics of the film bulk acoustic resonator 1. For example, the piezoelectric substrate is subjected to grinding where the substrate is brought into contact with fixed abrasive grains for grinding, and is then subjected to polishing where the substrate is brought into contact with free abrasive grains for grinding. Thereafter, a processing degradation layer generated on the piezoelectric substrate by above-mentioned polishing is removed by finish-polishing. If such processing is executed, the piezoelectric substrate can be ground at faster speed so as to improve productivity of the film bulk acoustic resonator 1, and also, the quality of the piezoelectric thin film 14 is improved so as to improve the characteristics of the film bulk acoustic resonator 1. It is to be noted that more specific methods for removal processing on the piezoelectric substrate is described in later-described examples.

In the film bulk acoustic resonator 1 as thus described, different from a case of forming the piezoelectric thin film 14 by sputtering or the like, since the piezoelectric material constructing the piezoelectric thin film 14 and the crystal orientation in the piezoelectric thin film 14 are free from constraints of the substrate, the degree of flexibility is high in selection of the piezoelectric material constructing the piezoelectric thin film 14 and the crystal orientation in the piezoelectric thin film 14. This facilitates realization of a desired characteristic in the piezoelectric thin film 14.

Upper Electrode and Lower Electrode

Subsequently, the upper electrode 15 and the lower electrode 13 are described with reference to FIGS. 1 and 2A to 2D. Here, FIG. 2A shows patterns of the upper electrode 15 and the additional film 16 when seen from above. FIG. 2B shows a pattern of the lower electrode 13 when seen from above. FIGS. 2C and 2D respectively show cross sections of the film bulk acoustic resonator 1 along cutting-plane lines A-A and B-B of FIG. 1.

The upper electrode 15 and the lower electrode 13 are conductive thin films obtained by formation of films of a conductive material.

The thicknesses of the upper electrode 15 and the lower electrode 13 are determined in consideration of adhesiveness to the piezoelectric thin film 14, electric resistance, withstand power, and the like. It is to be noted that in order to suppress variations in resonance frequencies and antiresonance frequencies of the film bulk acoustic resonator 1 caused by variations in acoustic velocity and film thickness of the piezoelectric thin film 14, the thicknesses of the upper electrode 15 and the lower electrode 13 may be adjusted as appropriate.

Although the conductive material constituting the upper electrode 15 and the lower electrode 13 is not particularly limited, the material is desirably selected from metals such as aluminum (Al), silver (Ag), copper (Cu), platinum (Pt), gold (Au), chromium (Cr), nickel (Ni), molybdenum (Mo), tungsten (W), and tantalum (Ta). Naturally, an alloy may be used as the conductive material constituting the upper electrode 15 and the lower electrode 13. Further, a plurality of kinds of conductive materials may be laminated to form the upper electrode 15 and the lower electrode 13.

As shown in FIGS. 1 and 2A to 2D, in the upper electrode 15 and the lower electrode 13, the upper electrode 151 and the lower electrode 131 are excitation electrodes to which excitation signals are applied, and opposed to each other with the piezoelectric thin film 14 interposed therebetween in a circular excitation region 141 (typically in the form of a circular with a diameter of 30 to 300 μm) where vibrations are excited. The upper electrode 151 formed on the upper surface of the piezoelectric thin film 14 is pulled out from the excitation region 141 in the −X direction, and the top of the upper electrode 151 is a pad 151P for connection with external wiring. Further, the lower electrode 131 formed on the lower surface of the piezoelectric thin film 14 is pulled out from the excitation region 141 in the +X direction, opposite to the direction in which the upper electrode 151 is pulled out, and the top of the lower electrode 131 is a pad 131P for connection with external wiring. It should be noted that in the film bulk acoustic resonator 1, in order to make the pad 131P connectable with the external wire, the piezoelectric thin film 14 in the vicinity of the pad 131P (portion indicated by a doffed line in FIG. 1) has been removed, to bring the pad 131P into an exposed state. In the film bulk acoustic resonator 1, when the excitation signals are applied to the upper electrode 151 and the lower electrode 131 via the pads 151P and 131P, an electric field E is generated inside the piezoelectric thin film 14 in the excitation region 141 where the upper electrode 151 and the lower electrode 131 are opposed to each other, to excite vibrations in the excitation region 141.

Additionally, in the film bulk acoustic resonator 1, an upper electrode 152, to which no excitation signal is to be applied, is formed on almost the whole surface of a region of the upper surface of the piezoelectric thin film 14 where the upper electrode 151 as the excitation electrode is not formed, except for a gap with the upper electrode 151 and the edge of the piezoelectric thin film 14. Similarly, a lower electrode 132, to which no excitation signal is to be applied, is formed on almost the whole surface of a region of the lower surface of the piezoelectric thin film 14 where the lower electrode 131 as the excitation electrode is not formed, except for a gap with the lower electrode 131 and the edge of the piezoelectric thin film 14. By the upper electrode 152 and the lower electrode 132, in the film bulk acoustic resonator 1, the electric field generated inside the piezoelectric thin film 14 in the non-excitation region 142 other than the excitation region 141 can be suppressed. With such a configuration, vibrations of an unexpected mode (here, vibrations other than thickness extension vibrations) can be suppressed so that the frequency impedance characteristic is unsusceptible to spuriousness.

Here, the upper electrode 152 and the lower electrode 132 are short-circuited in a short circuit section 143 on the end surface of the piezoelectric thin film 14. Therefore, in the film bulk acoustic resonator 1, in the region where the upper electrode 152 and the lower electrode 132 are opposed to each other with the piezoelectric thin film 14 interposed therebetween, a potential difference between the upper and lower surfaces of the piezoelectric thin film 14 is eliminated, to suppress the electric field in the thickness direction generated inside the piezoelectric thin film 14. Thereby, vibrations of an unexpected mode can further be suppressed so that the frequency impedance characteristic further becomes unsusceptible to spuriousness.

In addition, when the upper electrode 152 and the lower electrode 132 are grounded, the potentials of the upper and lower surfaces of the piezoelectric thin film 14 are fixed to zero in the region where the upper electrode 152 and the lower electrode 132 are formed, thereby to reduce the influence of stray capacitance in the film bulk acoustic resonator 1. Hence it is desirable to ground the upper electrode 15 and the lower electrode 13.

Additional Film

As shown in FIGS. 1 and 2A to 2D, the additional film 16 for adding a mass to the outside of the excitation region 141 is formed as superposed on the upper electrode 15 on the upper surface of the piezoelectric thin film 14.

A material for constituting the additional film 16 is not particularly limited. It may be the material of the same kind as the material for the upper electrode 15 and the lower electrode 13, or may be an insulating material such as silica dioxide ($SiO_2$). However, when formed of a conductive material such as a metal, the additional film 16 can be provided with a function as an electrode.

Figure 3:
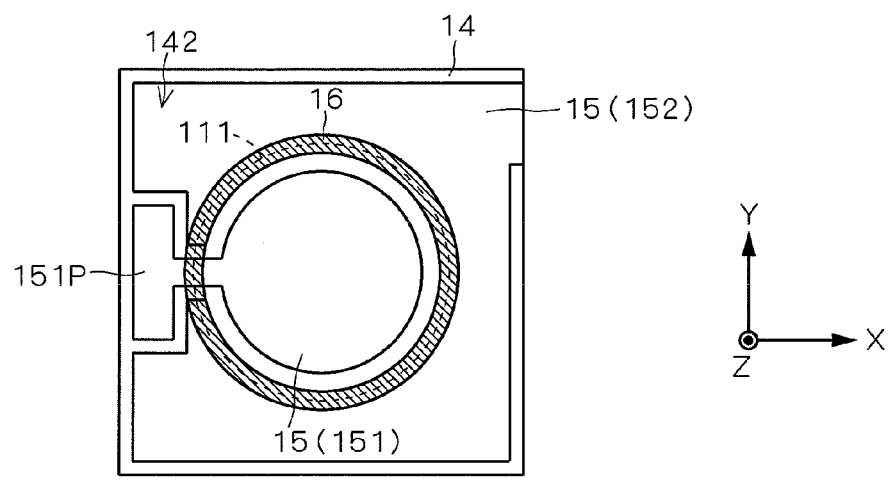
FIG. 3 is a view showing patterns of the upper electrode and the additional film.

The additional film 16 is formed on the outer edge section along the outer periphery of the excitation region 141, and has an incomplete circular ring pattern where the circular ring is interrupted by a gap section between the upper electrode 151 and the upper electrode 152. Even when frequency lowering type energy trapping cannot be realized by means of the mass of the excitation electrodes (the upper electrode 151 and the lower electrode 131), formation of the additional film 16 as thus described in addition to the upper electrode 15 and the lower electrode 13 with a uniform thickness makes the resonance frequency of the region where the additional film 16 is formed lower than that of the excitation region 141 by means of the mass of the additional film 16 to prevent diffusion of acoustic waves so that energy trapping can be realized in the excitation region 141. Namely, in the film bulk acoustic resonator 1, vibrations of an unexpected mode are suppressed by the additional film 16 so that the frequency impedance characteristic is unsusceptible to spuriousness. In addition, in a case where the additional film 16 is comprised of an insulating material, it is not necessary to consider a short circuit of the upper electrodes 151 and 152, and thereby, as shown in FIG. 3, the additional film 16 having a circular-ring pattern can be formed on the outer edge section of the excitation region 141 to completely enclose the excitation region 141.

Here, in the piezoelectric thin film 14, a region (hereinafter referred to as "separating region") 142 enclosing the excitation region 141 is separated from the support substrate 11 by a depression 111 slightly larger than the excitation region 141. However, the additional film 16 is formed across the boundary between the separating region 142 and its outside, namely the inner boundary of the incomplete circular ring pattern of the additional film 16 is located between the outer periphery of the excitation region 141 and the outer periphery of the separating region 142, and the region where the additional film 16 is formed is extended inside the separating region 142. With such a configuration, in the film bulk acoustic resonator 1, excess energy trapping due to the support substrate 11 supporting the piezoelectric thin film 14 is prevented from exerting an influence on the frequency impedance characteristic. In other words, the film bulk acoustic resonator 1 is configured such that the additional film 16 is formed over the section between the excitation region 141 and the separating region 142 to prevent outer periphery from becoming a fixed end and thereby prevent spuriousness generated by reflection of the acoustic waves in the outer periphery from exerting an influence on the frequency impedance characteristic.

The thickness of the additional film 16 as thus described should be determined so as to inhibit diffusion of the acoustic waves by the mass effect. Typically, a mass (specific gravity× thickness) per unit area of the additional film 16 may be not less than 0.1% and not more than 20%, desirably not less than 1% and not more than 10%, of the sum of a mass per unit area of the piezoelectric thin film 14 and a mass per unit area of the excitation electrodes (the upper electrode 151 and the lower electrode 131.

Second Embodiment

Figure 4:
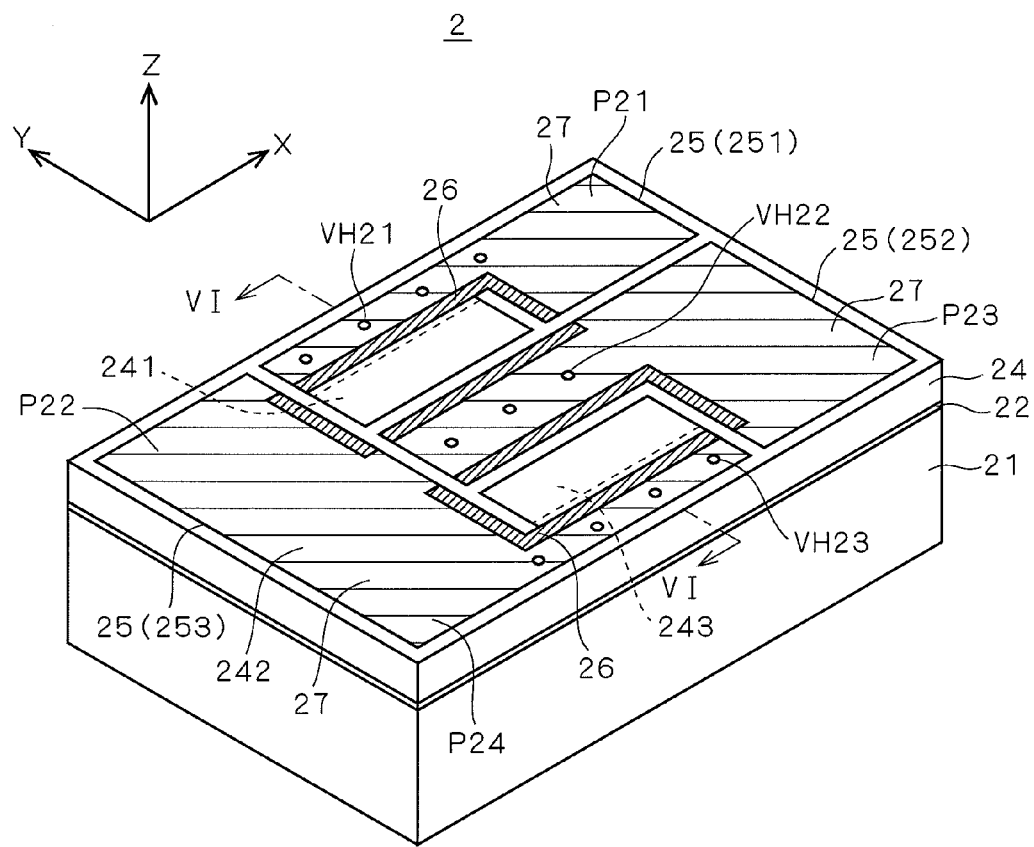
FIG. 4 is an oblique view showing a schematic configuration of a piezoelectric thin film filter according to a second embodiment of the present invention.

FIG. 4 is an oblique view showing a schematic configuration of a piezoelectric thin film filter 2 according to a second embodiment of the present invention. The piezoelectric thin film filter 2 is a ladder-type filter connecting two film bulk acoustic resonators in ladder shape.

As shown in FIG. 4, the piezoelectric thin film filter 2 has a configuration where an adhesive layer 22, a lower electrode 23 (231 to 233; not shown in FIG. 4, see FIGS. 5A, 5B and 6), a piezoelectric thin film 24, an upper electrode 25 (251 to 253), and additional films 26, 27 are laminated in this order on a support substrate 21. The piezoelectric thin film filter 2 of the second embodiment has a laminated structure similar to that of the film bulk acoustic resonator 1 of the first embodiment, and the support substrate 21, the adhesive layer 22, the lower electrode 23, the piezoelectric thin film 24, the upper electrode 25 and the additional film 26 of the piezoelectric thin film filter 2 are respectively the same as the support substrate 11, the adhesive layer 12, the lower electrode 13, the piezoelectric thin film 14, the upper electrode 15 and the additional film 16 of the film bulk acoustic resonator 1, except for the patterns of the lower electrode 23, the upper electrode 25 and the additional film 26. However, via holes VH21 to VH23, which pass through the upper and lower surfaces of the piezoelectric thin film 24 of the piezoelectric thin film filter 2, are formed by etching in the piezoelectric thin film 24. It is to be noted that in the following, repeated description of the same points as those of the film bulk acoustic resonator 1 is omitted, and in particular, the patterns of the lower electrode 23, the upper electrode 25 and the additional film 26, which are different from those in the film bulk acoustic resonator 1, are described.

Upper Electrode and Lower Electrode

Figure 5A:
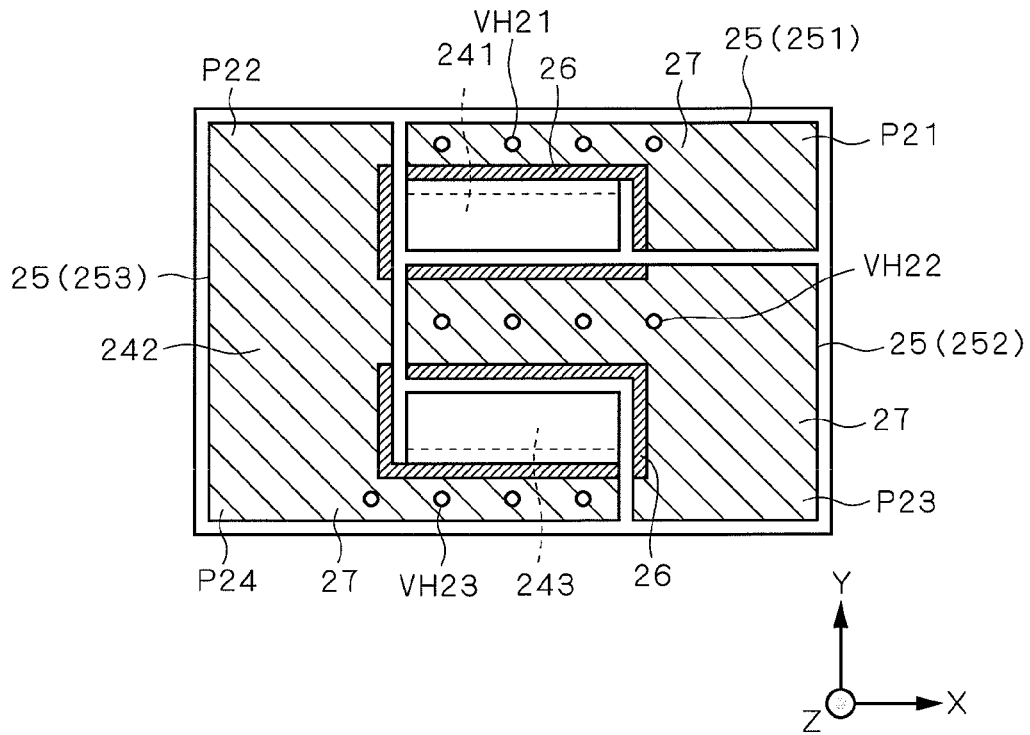
FIGS. 5A and 5B are views showing patterns of an upper electrode, a lower electrode, and additional films, when seen from above.
Figure 5B:
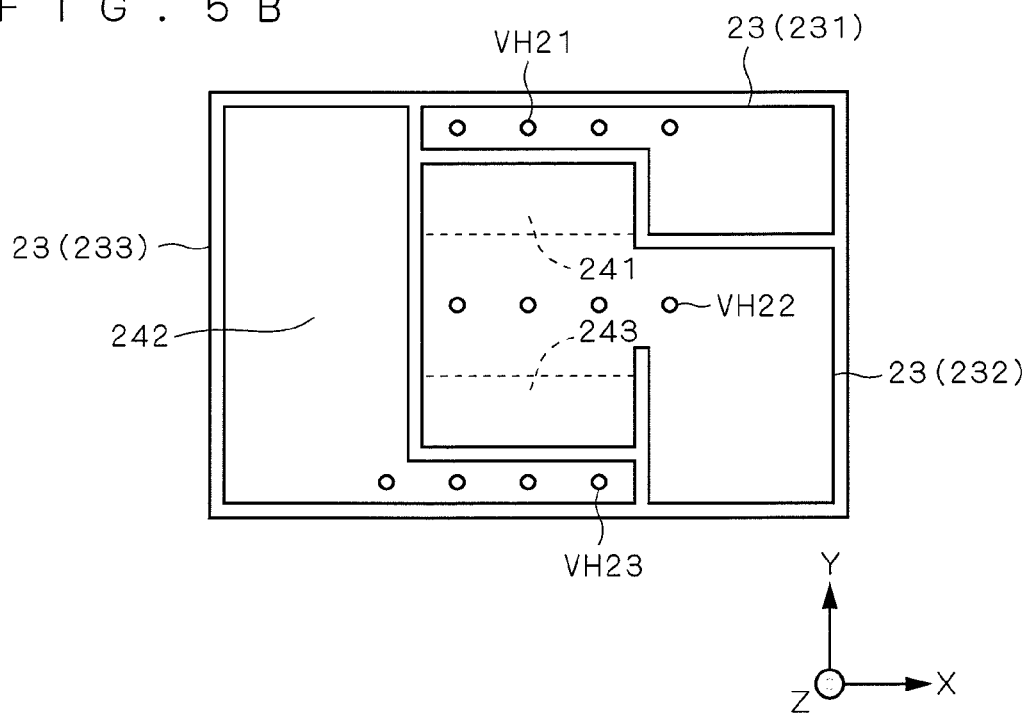
Figure 6:
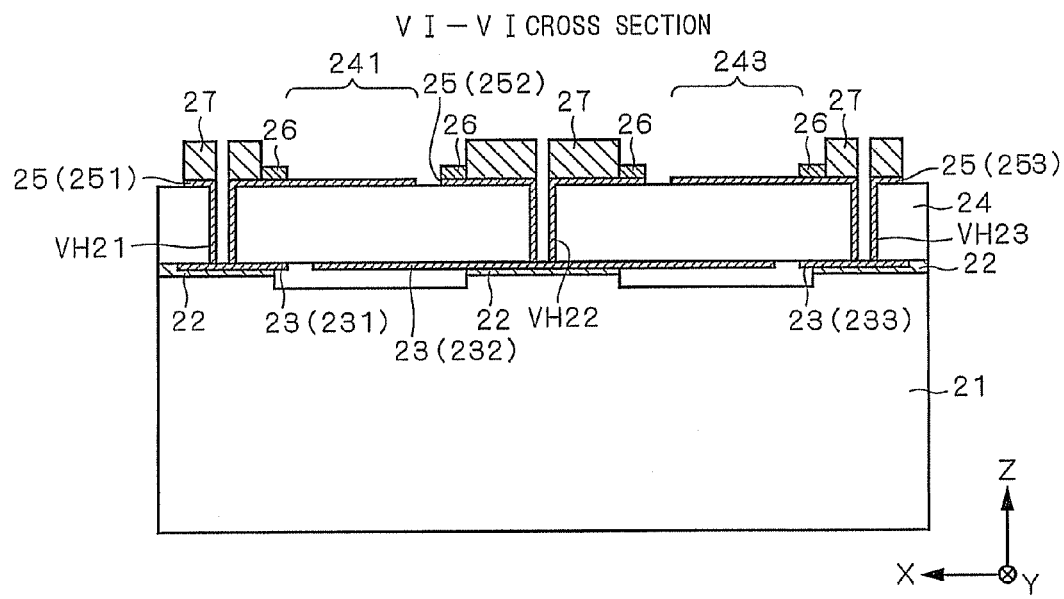
FIG. 6 is a sectional view of the piezoelectric thin film filter along a cutting-plane line VI-VI of FIG. 4.

FIGS. 6A and 5B are views showing patterns of the upper electrode 25, the lower electrode 23 and the additional films 26, 27. FIG. 5A shows patterns of the upper electrode 25 and the additional film 26, 27 when seen from above. FIG. 5B shows a pattern of the lower electrode 23 when seen from above. In FIGS. 5A and 5B, a region where the additional film 26 is formed is hatched with lines down to the left at 45 degrees, and a region where the additional film 27 is formed is hatched with lines down to the right at 45 degrees. Further, FIG. 6 shows a cross section of the piezoelectric thin film filter 2 along a cutting-plane line VI-VI of FIG. 4.

As shown in FIGS. 5A, 5B and 6, an upper electrode 251 is opposed to a lower electrode 232 with the piezoelectric thin film 24 interposed therebetween in an elongated rectangular excitation region 241, to constitute serial resonators of the ladder-type filter. After pulled out from the excitation region 241 in the +Y direction, the upper electrode 251 is bended in the +X direction and the −Y direction sequentially in its extending direction. Part of the upper electrode 251 is a pad P21 for connection with external wiring. Further, the upper electrode 251 is opposed to the lower electrode 231 with the piezoelectric thin film 24 interposed therebetween in a non-excitation region 242 other than the excitation regions 241 and 243.

The lower electrode 231 is opposed to a feeding section as a channel for feeding the excitation signal to a drive section (portion formed in the excitation region 241) of the upper electrode 251, with the piezoelectric thin film 24 interposed therebetween.

The upper electrode 251 and the lower electrode 231 are short-circuited by the via hole VH 21.

The upper electrode 253 is opposed to the lower electrode 232 with the piezoelectric thin film 24 interposed therebetween in the elongated rectangular excitation region 243, to constitute parallel resonators of the ladder-type filter. After pulled out from the excitation region 243 in the −Y direction, the upper electrode 253 is bended in the −X direction and the +Y direction sequentially in its extending direction. Part of the upper electrode 253 is pads P22, P24 for connection with external wiring. Further, the upper electrode 253 is opposed to a lower electrode 233 with the piezoelectric thin film 24 interposed therebetween in the non-excitation region 242.

The lower electrode 233 is opposed to a feeding section as a channel for feeding the excitation signal to a drive section (portion formed in the excitation region 243) of the upper electrode 251, with the piezoelectric thin film 24 interposed therebetween.

The upper electrode 253 and the lower electrode 233 are short-circuited by the via hole VH 21.

An upper electrode 252 is opposed to the lower electrode 232 with the piezoelectric thin film 24 interposed therebetween in the non-excitation region 242. Part of the upper electrode 252 is a pad P23 for connection with external wiring.

The lower electrode 232 is opposed to the upper electrode 251 with the piezoelectric thin film 24 interposed therebetween in the excitation region 241, and simultaneously opposed to the upper electrode 253 with the piezoelectric thin film 24 interposed therebetween in the excitation region 243. A feeding section as a channel for feeding the excitation signal to a drive section (portion formed in the excitation regions 241, 243) of the lower electrode 232 is opposed to the upper electrode 252 with the piezoelectric thin film 24 interposed therebetween in the non-excitation region 242.

The upper electrode 252 and the lower electrode 232 are short-circuited by the via hole VH22. Therefore, in the piezoelectric thin film filter 2, power of the excitation signal is supplied to the lower electrode 232 via the pad P23.

With such patterns of the upper electrode 25 and the lower electrode 23, the piezoelectric thin film filter 2 is configured to be a bi-directional ladder type filter where the pads P21 and P22 form a first input/output terminal pair and the pads P23 and P24 form a second input/output terminal pair.

In the piezoelectric thin film filter 2, as in the film bulk acoustic resonator 1 of the first embodiment, the upper electrode 25 and the lower electrode 23 are formed on almost the whole of the upper and lower surfaces of the piezoelectric thin film 24, and a potential difference between the upper and lower surfaces of the piezoelectric thin film 24 is eliminated in the non-excitation region 242, and hence the electric field is not generated inside the piezoelectric thin film 24 in the non-excitation region 242, thereby to suppress a sub resonance superposed on a main resonance generated by the serial resonators and the parallel resonators of the ladder-type filter.

Additional Film

As shown in FIGS. 4 to 6, the additional film 26 for adding a mass to the outsides of the excitation regions 241 and 243 is formed as superposed on the upper electrode 25 on the upper surface of the piezoelectric thin film 24. The additional film 26 is formed on the outer edge section along the outer peripheries of the excitation regions 241 and 243, and has an incomplete rectangular ring pattern where the ring is interrupted by gap sections among the upper electrode 251 to 253.

The material for and the thickness of the additional film 26 can be determined in the same manner as in the case of the additional film 16 of the film bulk acoustic resonator 1 in the first embodiment. In the piezoelectric thin film filter 2, since energy trapping into the excitation regions 241 and 243 can be realized by the additional film 26, it is possible to suppress the sub resonance superposed on the main resonance generated by the serial resonators and the parallel resonators of the ladder-type filter thereof, and also to prevent interference of the serial resonators and the parallel resonators with each other, so that a filtering characteristic is unsusceptible to a ripple.

Further, in the piezoelectric thin film filter 2, the conductive additional film 27 is further formed outside the region where the additional film 26 is formed, on the upper surface of the piezoelectric thin film 24. Although the material for the additional film 27 is not particularly limited, the material is desirably selected from metals such as aluminum (Al), silver (Ag), copper (Cu), platinum (Pt), gold (Au), chromium (Cr), nickel (Ni), molybdenum (Mo), tungsten (W) and tantalum (Ta). Naturally, an alloy may be used as the conductive material constituting the additional film. Further, a plurality of kinds of conductive materials may be laminated to form the additional film.

The additional film 27 serves to reduce electric resistance of the feeding section of the upper electrode 25 as a channel for feeding the excitation signal to the drive section of the upper electrode 25. Therefore, it is particularly desirable to select the material for the additional film 27 from metals having a small resistivity such as silver, copper and gold among the above-cited metals. With this additional film 27 arranged, it is possible to improve the characteristics of the piezoelectric thin film filter 2, especially to reduce the insertion loss. Additionally, in the piezoelectric thin film filter 2, as in the film bulk acoustic resonator 1 of the first embodiment, the upper electrode 25 and the lower electrode 23 are respectively formed on almost the whole of the upper and lower surfaces of the piezoelectric thin film 24, and a potential difference between the upper and lower surfaces of the piezoelectric thin film 24 is eliminated in the non-excitation region 242. Hence, also in the piezoelectric thin film filter 2, the electric field is not generated inside the piezoelectric thin film 24 in the non-excitation region 242, thereby to suppress the sub resonance superposed on the main resonance generated by the serial resonators and the parallel resonators of the ladder-type filter. Moreover, in the piezoelectric thin film filter 2, the additional film 27 is superposed on the upper electrode 25 to reduce electric resistance of the upper electrode 25, and it is thereby possible to further effectively suppress the electric field generated inside the piezoelectric thin film 24 in the non-excitation region 242. Therefore, in the piezoelectric thin film filter 2, with the existence of the additional film 27, it is possible to further effectively suppress the sub resonance superposed on the main resonance generated by the serial resonators and the parallel resonators of the ladder-type filter.

Moreover, in the piezoelectric thin film filter 2, as in the film bulk acoustic resonator 1 of the first embodiment, energy trapping into the excitation regions 241 and 243 has been realized by the additional film 26, and thereby, a state of the additional film 27 formed outside the region where the additional film 26 is formed has little influence on vibrations excited by the excitation regions 241 and 243. Therefore, the thickness of the additional film 27 can be determined in exclusive consideration of electric characteristics, and in order to sufficiently reduce the electric resistance of the feeding section, the thickness of the additional film 27 is desirably larger than that of the additional film 26, for example not smaller than 3000 angstroms, and desirably not smaller than 10000 angstroms. For the same reason, the material for the additional film 27 can be determined in exclusive consideration of the electric characteristics, and in order to sufficiently reduce the electric resistance of the feeding section, the material for the additional film 27 is desirably a conductive material having a low resistivity.

In addition, as shown in FIGS. 4 to 6, from the aspect of reducing the electric resistance of the feeding section, it is most desirable that the additional film 27 be formed as superposed on the whole surface of the feeding section except for the region where the additional film 26 is formed. However, this does not deny forming by superposing the additional film 27 on part of the feeding section.

EXAMPLES

In the following described are Examples 1 and 2 according to the first embodiment of the present invention and Comparative Example out of the range of the present invention.

Example 1

In Example 1, the film bulk acoustic resonator 1 was produced using: a single crystal of lithium niobate as the piezoelectric material constructing the support substrate 11 and the piezoelectric thin film 14; an epoxy adhesive agent as a material constituting the adhesive layer 12; molybdenum and tantalum as the conductive materials to constitute the lower electrode 13; chromium and gold as the conductive material constituting the upper electrode 15; and chromium as the conductive material constituting the additional film 16.

Figure 7:
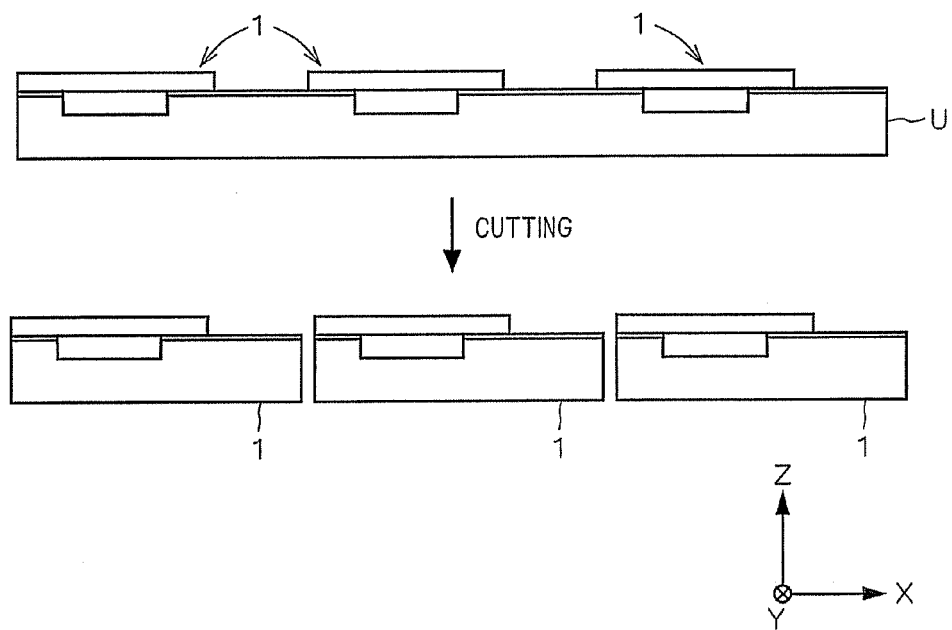
FIG. 7 is a sectional view showing a state of cutting an assembly integrating a large number of film bulk acoustic resonators into separate film bulk acoustic resonators.

As shown in a sectional view of FIG. 7, in order to reduce manufacturing cost, the film bulk acoustic resonator 1 according to Example 1 is obtained in the following manner. After production of an assembly U by integration of a large number of film bulk acoustic resonators 1, the assembly U is cut by a dicing saw into individual film bulk acoustic resonators 1. It is to be noted that, although the example of including three film bulk acoustic resonators 1 in the assembly U is shown in FIG. 7, the number of film bulk acoustic resonators 1 included in the assembly U may be four or larger, and typically, several hundreds to several thousands of film bulk acoustic resonators 1 are included in the assembly U.

Although description is made with focus on one film bulk acoustic resonator 1 included in the assembly U for the sake of simplicity, the other film bulk acoustic resonators 1 included in the assembly are produced simultaneously with the focused film bulk acoustic resonator 1.

Subsequently, the method for manufacturing the film bulk acoustic resonator 1 according to Example 1 is described with reference to FIGS. 8A to 8C and 9A to 9C. It is to be noted that FIGS. 8A to 8C and FIGS. 9A to 9C are sectional views along the cutting-plane line B-B of FIG. 1.

Figure 8A:
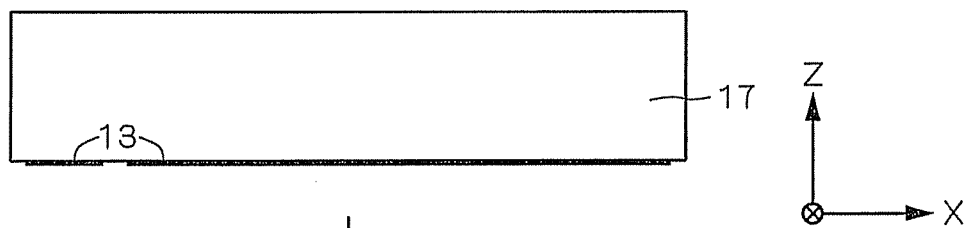
FIGS. 8A to 8C are views for explaining a method for manufacturing the film bulk acoustic resonator.
Figure 8B:
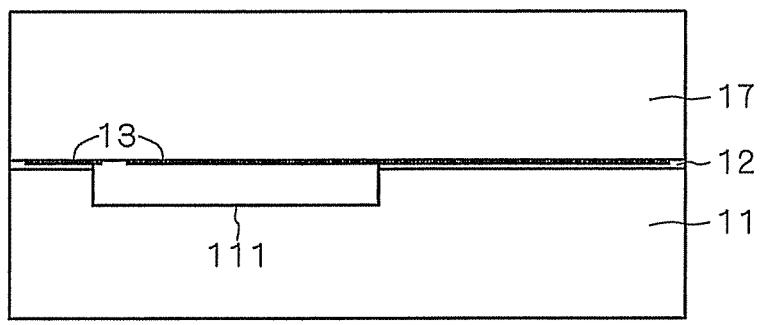
Figure 8C:
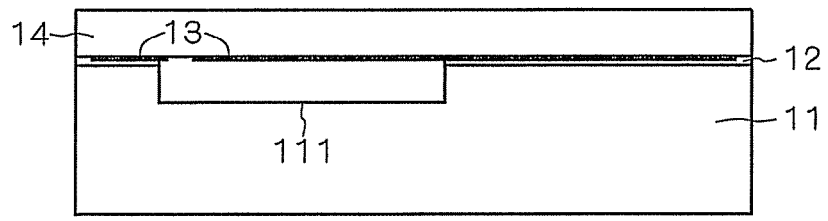

With reference to FIGS. 8A to 8C, first, a circular wafer (36-degree-cut Y plate) of a single crystal of lithium niobate having a thickness of 0.5 mm and a diameter of 3 inches was prepared as the support substrate 11 and a piezoelectric substrate 17. Subsequently, a molybdenum film having a thickness of 0.057 μm and a tantalum film having a thickness of 0.02 μm were formed on the lower surface of the piezoelectric substrate 17 by sputtering, and the lower electrode 13 having the pattern shown in FIG. 2B was obtained by photolithography (FIG. 8A).

Subsequently, an epoxy adhesive agent to be the adhesive layer 12 was applied to the upper surface of the support substrate 11 where the depression 111 had been formed by etching, to bond the upper surface of the support substrate 11 with the lower surface of the piezoelectric substrate 17. Pressure was then applied to the support substrate 11 and the piezoelectric substrate 17 for press pressure bonding, to make the adhesive layer 12 have a thickness of 0.5 μm. Thereafter, the support substrate 11 and the piezoelectric substrate 17 were left to stand in a 200° C. environment for one hour for curing the epoxy adhesive agent, so as to bond the support substrate 11 with the piezoelectric substrate 17 (FIG. 8B).

After completion of bonding of the support substrate 11 with the piezoelectric substrate 17, while the piezoelectric substrate 17 was kept in a state of being bonded to the support substrate 11, the lower surface of the support substrate 11 was fixed to a polishing jig made of silicon carbide (SiC), and the upper surface of the piezoelectric substrate 17 was subjected to grinding processing using a grinding machine with fixed abrasive grains, to reduce the thickness of the piezoelectric substrate 17 down to 50 μm. Further, the upper surface of the piezoelectric substrate 17 was subjected to polishing processing using diamond abrasive grains, to reduce the thickness of the piezoelectric substrate 17 down to 2 μm. Finally, for removing a process degradation layer generated on the piezoelectric substrate 17 by polishing processing using the diamond abrasive grains, free abrasive grains and a non-woven polishing pad were used to perform finish-polishing on the piezoelectric substrate 17 so as to obtain the piezoelectric thin film 14 having a thickness of 1 μm (FIG. 8C).

Figure 9A:
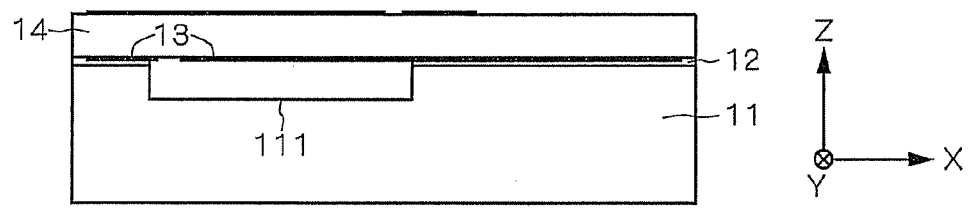
FIGS. 9A to 9C are views for explaining the method for manufacturing the film bulk acoustic resonator.

Subsequently, the upper surface (polished surface) of the piezoelectric thin film 14 was washed using an organic solvent, and a chromium film having a thickness of 0.02 μm and a gold film having a thickness of 0.0515 μm were formed by sputtering, and the upper electrode 15 having the pattern shown in FIG. 2A was obtained by photolithography (FIG. 9A).

Figure 9B:
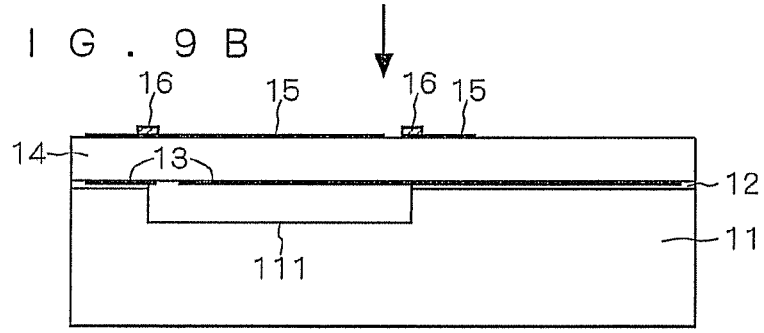

Further, a chromium film having a thickness of 0.097 μm was formed as superposed on the upper electrode 15 by sputtering, and the additional film 16 having the pattern shown in FIG. 2A was obtained by photolithography (FIG. 9B).

Figure 9C:
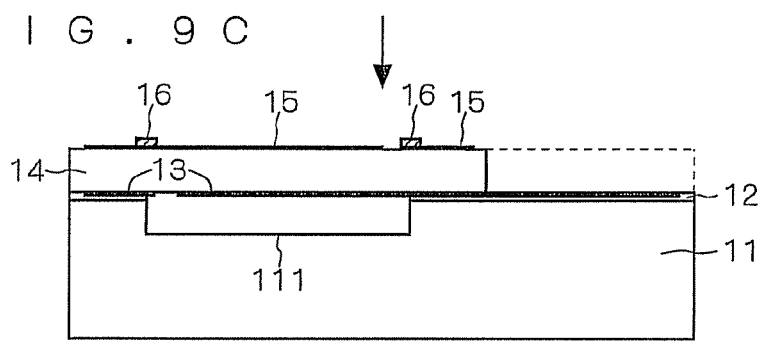

Further, a portion of the piezoelectric thin film 14 covering a pad 131P of a lower electrode 131 was removed by etching using hydrofluoric acid, to obtain the film bulk acoustic resonator 1 with the pad 131P exposed (FIG. 9C).

Figure 10:
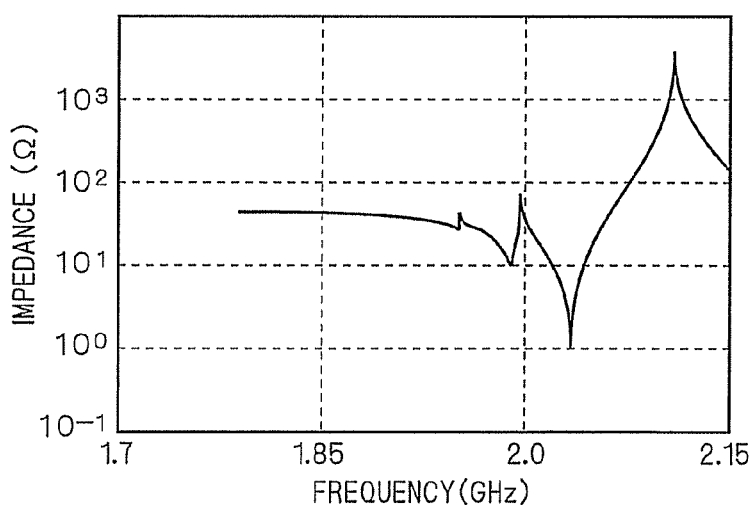
FIG. 10 is a view showing a frequency impedance characteristic of a film bulk acoustic resonator according to Example 1.

A frequency impedance characteristic of the film bulk acoustic resonator 1 as thus obtained was estimated using a network analyzer and a prober, to obtain a waveform shown in FIG. 10.

It is to be noted that since respective specific gravities of molybdenum, tantalum, lithium niobate, chromium and gold are 10.2, 16.6, 4.64, 7.2 and 19.4 g/cm$^3$, in the film bulk acoustic resonator 1 according to Example 1, the mass per unit area of the additional film 16 is $0.698 \times 10^{-12}$ g/m$^2$ ($=0.097$ μm$\times 7.2$ g/cm$^3$), which is 10.4% of the sum of the mass per unit area of the piezoelectric thin film 14 and the mass per unit area of the excitation electrode in the excitation region 141 ($6.70 \times 10^{-12}$ g/m$^2$ ($=0.057$ μm$\times 10.2$ g/cm$^3$+0.02 μm$\times 16.6$ g/cm$^3$+1 μm$\times 4.64$ g/cm$^3$+0.02 μm$\times 7.2$ g/cm$^3$+ 0.0515 μm$\times 19.4$ g/cm$^3$)).

Example 2

In Comparative Example, the film bulk acoustic resonator 1 was manufactured in the same procedure as in Example 1 except that the thickness of the chromium film as the additional film 16 was 0.06 μm. A frequency impedance characteristic of the film bulk acoustic resonator 1 as thus obtained was estimated using the network analyzer and the prober, to obtain a waveform shown in FIG. 11.

It is to be noted that in the film bulk acoustic resonator 1 according to Example 2, the mass per unit area of the additional film 16 is $0.432 \times 10^{-12}$ g/m² (=0.06 μm×7.2 g/cm³), which is 6.5% of the sum of the mass per unit area of the piezoelectric thin film 14 and the mass per unit area of the excitation electrode in the excitation region 141 ($6.70 \times 10^{-12}$ g/m² (=0.057 μm×10.2 g/cm³+0.02 μm×16.6 g/cm³+1 μm×4.64 g/cm³+0.02 μm×7.2 g/cm³+0.0515 μm×19.4 g/cm³)).

Comparative Example

In Comparative Example, the film bulk acoustic resonator 1 was manufactured in the same procedure as in Example 1 except that the chromium film as the additional film 16 was not formed. A frequency impedance characteristic of the film bulk acoustic resonator as thus obtained was estimated using the network analyzer and the prober, to obtain a waveform shown in FIG. 12.

Comparison Among Examples 1 and 2, and Comparative Example

As apparent from Examples 1 and 2, and Comparative Example, in the film bulk acoustic resonator 1, formation of the additional film 16 for adding a mass to the outside of the excitation region 141 makes the frequency impedance characteristic unsusceptible to spuriousness so that an increase in resonance resistance can be avoided. The effect of the additional film can be obtained not only in each case of combination of the specific material and film thickness described in the above Examples, but in a case of another film configuration. Further, it is found that the degree of the effect of the additional film was determined by a ratio of the mass per unit area of the additional film to the mass per unit area of the piezoelectric thin film regardless of the film configuration. In particular, as shown in Example 2, it is possible to effectively suppress spuriousness especially when the mass per unit area of the additional film 16 is set to not less than 1% and not more than 10% of the sum of the mass per unit area of the piezoelectric thin film 14 and the mass per unit area of the excitation electrode (the upper electrode 151 and the lower electrode 131) in the excitation region 141.

It is to be noted that the piezoelectric thin film filter 2 according to the second embodiment can also be manufactured in the same manner as in Examples 1 and 2. In this case, if the via holes VH21 to VH23 are formed by etching or the like prior to formation of the upper electrode 25, a metal film is formed on the internal surface of each of the via holes VH21 to VH 23, so that the via holes can serve as through holes for short-circuiting the upper electrode 25 and the lower electrode 23.

Modified Example

Although the piezoelectric thin film device comprising a single film bulk acoustic resonator and the piezoelectric thin film device comprising two film bulk acoustic resonators were described above, the piezoelectric thin film device of the present invention typically means piezoelectric thin film devices in general which include a single or a plurality of film bulk acoustic resonators. Such piezoelectric thin film devices include an oscillator, a trap and the like, each comprising a single film bulk acoustic resonator, and a filter, a duplexer, a triplexer, a trap, and the like, each comprising a plurality of film bulk acoustic resonators.

Further, although the film bulk acoustic resonator was described above which uses an electrical response due to thickness extension vibrations excited by the piezoelectric thin film, a mode other than the thickness extension vibrations, such as thickness shear vibrations may also be used.

Moreover, although the description was made above assuming that the excitation region was in circular or rectangular shape, the shape of the excitation region is not limited to the circular or rectangular shape, but may be another shape (e.g. polygonal). When the excitation region is in polygonal shape, the longest diagonal line typically has a length of 30 to 300 μm.

Figure 13:
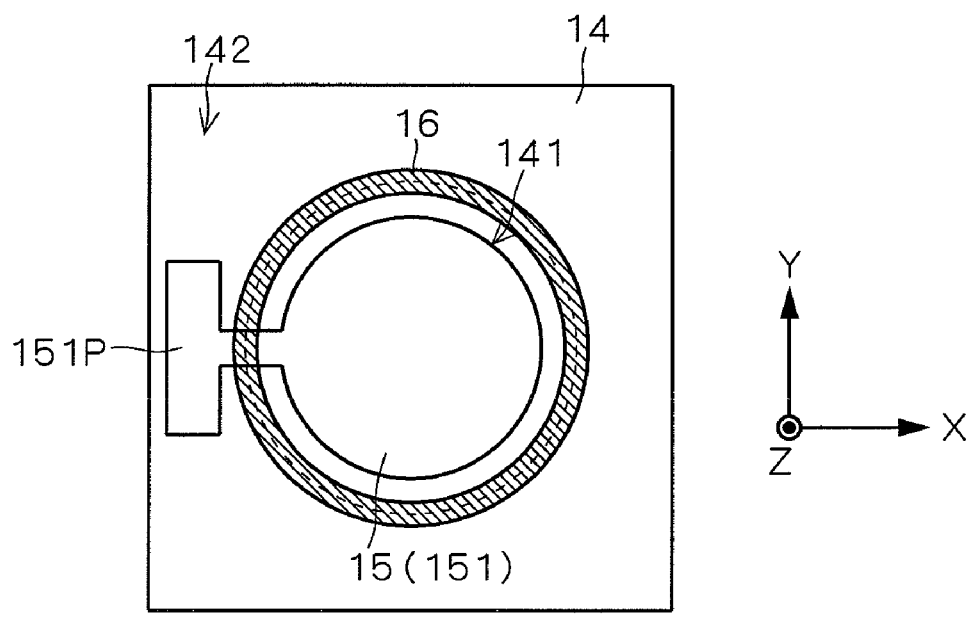
FIG. 13 is a view showing patterns of an upper electrode and an additional film.

It should be noted that, while the example in which the additional film 16 is formed as superposed on the upper electrode 15 was shown above, as shown in FIG. 13, instead of forming the electrode (upper electrode 152) other than the upper electrode 151 as the excitation electrode, the additional film 16 may be directly formed on the piezoelectric thin film 14.

While the invention has been shown and described in detail, the foregoing description is in all aspects illustrative and not restrictive. It is therefore understood that numerous modifications and variations can be devised without departing from the scope of the invention.

What is claimed is:

1. A piezoelectric thin film device including a single or a plurality of film bulk acoustic resonators, the piezoelectric thin film device comprising:
    a piezoelectric thin film;
    a support for supporting said piezoelectric thin film;
    electrode films formed on both main surfaces of said piezoelectric thin film and having predetermined patterns;
    a first additional film formed outside an excitation region for exciting vibrations on at least one of the main surfaces of said piezoelectric thin film; and
    a second additional film having a conducting property and formed outside a region having said first additional film formed thereon on the main surface of said piezoelectric thin film having said first additional film formed thereon,
    wherein said second additional film has a thickness larger than that of said first additional film.

2. The piezoelectric thin film device according to claim 1, wherein
    said first additional film is formed on an outer edge section along an outer periphery of said excitation region.

3. The piezoelectric thin film device according to claim 1, wherein
    a material constituting said first additional film is a metal.

4. The piezoelectric thin film device according to claim 1, wherein
    a region having said first additional film formed thereon extends inside a region separated from said support and enclosing said excitation region.

5. The piezoelectric thin film device according to claim 1, wherein
    thickness vibrations are excited in said excitation region.

6. A piezoelectric thin film device including a single or a plurality of film bulk acoustic resonators, the piezoelectric thin film device comprising:
    a piezoelectric thin film;
    a support for supporting said piezoelectric thin film;
    electrode films formed on both main surfaces of said piezoelectric thin film and having predetermined patterns;

an additional film formed outside an excitation region for exciting vibrations on at least one of the main surfaces of said piezoelectric thin film, wherein a piezoelectric material constituting said piezoelectric thin film is lithium niobate; and said piezoelectric thin film and said support are bonded to each other via an adhesive layer.

7. A piezoelectric thin film device including a single or a plurality of film bulk acoustic resonators, the piezoelectric thin film device comprising:

a piezoelectric thin film;

a support for supporting said piezoelectric thin film;

electrode films formed on both main surfaces of said piezoelectric thin film and having predetermined patterns; and an additional film formed outside an excitation region for exciting vibrations on at least one of the main surfaces of said piezoelectric thin film, wherein a cavity which separates said excitation region from said support is formed in said support;

a region having said additional film formed thereon extends inside a region separated from said support and enclosing said excitation region; and said additional film lowers a resonance frequency of said region having said additional film formed thereon lower than a resonance frequency of said excitation region.

8. A piezoelectric thin film device including a single or a plurality of film bulk acoustic resonators, the piezoelectric thin film device comprising:

a piezoelectric thin film;

a support for supporting said piezoelectric thin film;

electrode films formed on both main surfaces of said piezoelectric thin film and having predetermined patterns;

an additional film formed outside an excitation region for exciting vibrations on at least one of the main surfaces of said piezoelectric thin film, wherein a mass per unit area of said additional film formed as superposed on said electrode film is not less than 0.1% and not more than 20% of a sum of a mass per unit area of said piezoelectric thin film and a mass per unit area of said electrode film in said excitation region.

9. The piezoelectric thin film device according to claim 8, wherein the mass per unit area of said additional film formed as superposed on said electrode film is not less than 1% and not more than 10% of the sum of the mass per unit area of said piezoelectric thin film and the mass per unit area of said electrode film in said excitation region.

* * * * *